(12) United States Patent
Alivov et al.

(10) Patent No.: US 11,094,494 B2
(45) Date of Patent: Aug. 17, 2021

(54) WINDOW MEMBER FOR AN X-RAY DEVICE

(71) Applicant: Oxford Instruments X-ray Technology Inc., Scotts Valley, CA (US)

(72) Inventors: Yahya Alivov, Scotts Valley, CA (US); Christopher K. McKenzie, Half Moon Bay, CA (US); Bryant Grigsby, Aptos, CA (US); Andrey Degtyaryov, Campbell, CA (US)

(73) Assignee: OXFORD INSTRUMENTS X-RAY TECHNOLOGY INC., Scotts Valley, CA (US)

( * ) Notice: Subject to any disclaimer, the term of this patent is extended or adjusted under 35 U.S.C. 154(b) by 0 days.

(21) Appl. No.: 16/788,028

(22) Filed: Feb. 11, 2020

(65) Prior Publication Data
US 2020/0176212 A1 Jun. 4, 2020

Related U.S. Application Data

(63) Continuation of application No. 15/783,457, filed on Oct. 13, 2017, now abandoned.

(51) Int. Cl.
*C23C 16/40* (2006.01)
*H01J 5/18* (2006.01)
(Continued)

(52) U.S. Cl.
CPC ............... *H01J 5/18* (2013.01); *C23C 16/403* (2013.01); *C23C 16/405* (2013.01);
(Continued)

(58) Field of Classification Search
CPC ........ H01J 5/18; H01J 35/18; H01J 2235/183; C23C 16/403; C23C 16/488;
(Continued)

(56) References Cited

U.S. PATENT DOCUMENTS

| 5,182,143 A | * | 1/1993 | Holmes-Farley | ..... C03C 17/009 |
| | | | | 427/409 |
| 5,226,067 A | * | 7/1993 | Allred | ...................... G21K 1/10 |
| | | | | 378/140 |

(Continued)

FOREIGN PATENT DOCUMENTS

| JP | S5782954 | 5/1982 |
| WO | WO2014017332 A1 | 1/2014 |

OTHER PUBLICATIONS

International Search Report of International Application No. PCT/GB2018/052945.

*Primary Examiner* — Mark R Gaworecki
(74) *Attorney, Agent, or Firm* — Blank Rome LLP (57) ABSTRACT

A window member for separating an internal environment of an x-ray device from an environment external to the x-ray device is provided. The window member comprises a substrate and a coating layer disposed upon a surface of the substrate. The substrate is formed from a polycrystalline material and is substantially transparent to low-energy x-rays. The coating layer is non-porous, covers the crystal grains at the surface of the substrate and extends into the grain boundaries therebetween, such that the coating layer forms an impermeable barrier between the substrate and the external environment.

23 Claims, 8 Drawing Sheets

(51) Int. Cl.
*H01J 35/18* (2006.01)
*C23C 16/48* (2006.01)
*C23C 16/455* (2006.01)

(52) U.S. Cl.
CPC ...... *C23C 16/45555* (2013.01); *C23C 16/488* (2013.01); *H01J 35/18* (2013.01); *C23C 16/45525* (2013.01); *H01J 2235/183* (2013.01)

(58) Field of Classification Search
CPC ............ C23C 16/45555; C23C 16/405; C23C 16/45525; C23C 6/488
USPC ........................................................ 378/161
See application file for complete search history.

(56) References Cited

U.S. PATENT DOCUMENTS

| | | | | |
|---|---|---|---|---|
| 5,382,314 A * | 1/1995 | Jin | ............. | H01L 21/306 156/60 |
| 5,491,331 A * | 2/1996 | Armentrout | ......... | H01J 31/505 250/207 |
| 5,528,646 A * | 6/1996 | Iketaki | .................. | G21K 7/00 378/43 |
| 5,740,228 A * | 4/1998 | Schmidt | .................. | G21K 1/10 378/161 |
| 5,776,246 A * | 7/1998 | Tanabe | .................. | C23C 16/27 117/89 |
| 5,853,478 A * | 12/1998 | Yonehara | ......... | H01L 21/02543 117/89 |
| 5,937,598 A * | 8/1999 | Rain | .................. | G21F 7/03 52/204.591 |
| 6,495,836 B1 * | 12/2002 | Hata | .................. | G01T 1/2018 250/370.09 |
| 7,756,251 B2 * | 7/2010 | Davis | .................. | H01J 5/18 378/161 |
| 2002/0074502 A1 * | 6/2002 | Takabayashi | ............ | G21K 4/00 250/368 |
| 2004/0120466 A1 * | 6/2004 | Turner | .................. | H01J 9/26 378/161 |
| 2004/0195960 A1 * | 10/2004 | Czeremuszkin | ........ | C08J 7/0423 313/504 |
| 2008/0296479 A1 * | 12/2008 | Anderson | ................ | H01J 5/18 250/226 |
| 2008/0296518 A1 * | 12/2008 | Xu | ........................... | H01J 5/18 250/505.1 |
| 2009/0086923 A1 * | 4/2009 | Davis | ........................ | H01J 5/18 378/161 |
| 2009/0110151 A1 * | 4/2009 | Damento | .................. | G01T 1/20 378/167 |
| 2009/0173897 A1 * | 7/2009 | Decker | .................... | H01J 5/18 250/505.1 |
| 2010/0215912 A1 * | 8/2010 | Kubota | .................. | C23C 14/325 428/172 |
| 2012/0087476 A1 * | 4/2012 | Liddiard | ................... | H01J 5/18 378/140 |
| 2012/0267240 A1 * | 10/2012 | Ke | ........................ | H01G 9/2031 204/242 |
| 2012/0314837 A1 | 12/2012 | Tsujii | | |
| 2013/0037717 A1 * | 2/2013 | Eggert | ...................... | G01T 7/00 250/336.1 |
| 2013/0077761 A1 * | 3/2013 | Sipila | ........................ | G21K 1/02 378/161 |
| 2013/0089184 A1 * | 4/2013 | Sipila | ........................ | G21K 1/02 378/161 |
| 2013/0094629 A1 * | 4/2013 | Liddiard | ................... | H01J 5/18 378/140 |
| 2014/0117569 A1 * | 5/2014 | Schmid | ............. | H01L 21/02274 257/790 |
| 2015/0053640 A1 * | 2/2015 | Kostamo | ............. | B32B 38/0004 216/24 |
| 2015/0146866 A1 * | 5/2015 | Tuohimaa | ............. | H01J 35/025 378/140 |
| 2015/0162161 A1 * | 6/2015 | Yamada | .................. | C23C 16/27 378/62 |
| 2015/0240353 A1 * | 8/2015 | Fukunaga | ............... | C23C 16/32 428/216 |
| 2016/0020061 A1 * | 1/2016 | Ikarashi | .................. | H01J 35/08 378/64 |
| 2017/0154749 A1 * | 6/2017 | Torma | .................... | C23C 16/32 |

* cited by examiner

WINDOW MEMBER FOR AN X-RAY DEVICE

CROSS-REFERENCE TO RELATED APPLICATION(S)

This application is a Continuation of U.S. patent application Ser. No. 15/783,457, filed Oct. 13, 2017, which is hereby incorporated herein by reference in its entirety.

FIELD OF THE INVENTION

The present invention relates to a window member for an x-ray device, and in particular for separating an internal environment of an x-ray device from an environment external to the x-ray device.

BACKGROUND TO THE INVENTION

X-ray photons generated or to be detected in sensors are typically required to be transmitted through windows that separate ambient air from the vacuum environments typically found in x-ray devices. X-ray devices have radiation exit or entrance windows that sustain the difference in environments between the inside and the outside of the device while allowing x-rays to be transmitted through the window. An x-ray window typically comprises a window member generally formed from a sheet of material that is placed over an opening or entrance to the x-ray tube or x-ray detector, or other x-ray device. Low atomic number materials are generally used to form these windows as they allow x-ray transmission in the low energy region corresponding to 0.5-10.0 keV.

X-ray windows are typically made from a wide range of materials of low atomic number, including beryllium, aluminium, titanium, silicon nitride, and diamond. These window materials suffer from two deleterious effects owing to their exposure to ambient environments which cause the windows to fail. Firstly, since x-ray windows are typically formed from polycrystalline materials, gas may penetrate through the boundaries between crystal grains. In addition to this, the materials suffer from corrosion caused by the material reacting with ambient water vapour, leading to the formation of an oxide layer on the window surface. Such oxide layers, once formed, may then peel off, thus gradually reducing the thickness of the windows over time. Eventually, the thickness of an x-ray window may be reduced to such a thickness that it can fail to sustain a vacuum inside the x-ray device.

Conventionally the solution to the problem of window failure involves coating the window with a protective layer that is resistant to corrosion. Candidate materials for this are required to have minimal soft x-ray attenuation qualities, which is determined by the mass attenuation coefficient and the thickness of the coating material. For this reason, coatings that are as thin as possible and have constituent elements with low atomic numbers are most suited to this purpose. Additionally, such windows should be capable of withstanding pressures that result from differential pressure between internal and external environments, gravity, and thermal stresses.

Efforts have been made in the past to overcome the problem of corrosion of x-ray windows. Several approaches have aimed to solve this problem—for example U.S. Pat. Nos. 5,226,067 and 5,740,228. U.S. Pat. No. 5,226,067 introduced coating with amorphous boron hydride (a-B:H) and other amorphous boron hydride alloys (a-B:X:H) where X is another element of low atomic number. However, these layers have poor thermal stability, decomposing at 200° C., which precludes standard brazing technology that requires processing temperatures as high as 700° C. The other disadvantage of boron hydride-based coatings is that growth chamber during thin film growth is contaminated with the boron-containing gas and so is not available for other processes. Therefore a separate device is required for the B:H:X coating process. U.S. Pat. No. 5,740,228 used silicon oxide ($SiO_2$), silicon nitride (SiN), silicon carbide (SiC), and amorphous carbon (a-C) as coating layers. These coating layers were grown using sputtering and chemical vapour deposition (CVD) methods and the thickness varied between 300 nm and 500 nm. However, sputtering growth is a non-equilibrium, highly anisotropic growth method which means that grain boundaries form, providing channels for air to contact the window and to begin the degradation process. With CVD the quality of the layer is better. However, the high growth rate of this method makes it difficult to control film thickness to nanometre scale.

In view of this, a need exists for an x-ray window that is not prone to deterioration caused by exposure to external environments and is also optimally transparent to low energy x-rays. The present invention is aimed at solving this problem.

SUMMARY OF THE INVENTION

In accordance with the invention there is provided a window member for separating an internal environment of an x-ray device from an environment external to the x-ray device, the window member comprising a substrate and a coating layer disposed upon a surface of the substrate, wherein the substrate is formed from a polycrystalline material and is substantially transparent to low energy x-rays, and the coating layer is non-porous, covers the crystal grains at the surface of the substrate, and extends into the grain boundaries therebetween, such that their coating layer forms an impermeable barrier between the substrate and the external environment. The inventors have realised that the deterioration and failure of x-ray window members can be alleviated by providing a substrate in which both the penetration of gas through grain boundaries and the oxidation of the substrate material, such as beryllium, is prevented or reduced by the presence of a coating layer that isolates and protects the substrate from the external environment. The window member advantageously includes a coating layer that is impenetrable by environmental factors such as air or oxygen and moisture, and covers and conforms to the external surfaces, including those that extend into the grain boundaries, of crystal grains in the substrate that would, in the absence of the coating layer, be exposed to such factors.

In the window members of the prior art, air molecules taking paths between grain boundaries by way of diffusion processes could cause leakage and eventual device failure. Coating of x-ray window substrates with materials that are resistant to corrosion can significantly reduce the corrosion suffered by the window substrate since grain surfaces are covered with deposited materials, and no holes and no pores are formed within the coating layer through which the window member may be exposed to ambient air.

The penetration of the coating layer into the boundaries between the crystal grains at the surface of the substrate means that the barrier defined by the coating extends continuously over, and covers all of, the surface of the substrate so that no part of the surface may be contacted by external environment atmosphere, gas, or fluid. The extent to which the coating layer extends or penetrates into the grain boundaries is typically defined by the size or width of the grain boundary at a particular depth, that is by the scale of the gap between adjacent grains. The coating layer typically extends as deep into a given grain boundary as the depth below the outermost surface of the grains at which the size of the gap reaches the order of atomic size. Typically, and in materials from which x-ray window substrates are commonly constructed such as beryllium, the width of a grain boundary gap narrows with increasing depth below the outer surface, such that at a depth of around 100 nm below the surface of the substrate or of the outer crystal grains, the distance between the grains is at the atomic scale. Therefore the coating layer of the window member typically extends into the grain boundaries to a depth of at least 100 nm below the surface. In other words, the coating layer typically extends into each of the grain boundaries of the window member to a depth at which the space in between the grains at the boundary is on the atomic scale. At this depth, the gaps between grains are too small for atomic layer deposition (ALD) precursors to diffuse so as to coat grain boundaries during coating layer growth.

The depth to which the coating layer extends into the grain boundaries may typically be measured or defined as the depth below or into the outermost extremity of the rough, polycrystalline surface, the average plane or height of the crystal surface. The depth is typically defined in a "vertical" direction, that is, normal to the plane of the substrate or the substrate surface. The depth within a boundary may be defined as the "vertical" distance between the top of a grain and the first joint point with a neighbouring grain, that is where it contacts or is an atomic-scale distance from it, with which the given grain shares the boundary. This depth is influenced by the roughness or finish of the beryllium disc surface, which may vary between manufacturers or according to surface requirements.

As noted above, it is advantageous that there are no gaps in the coating layer through which a portion of the substrate surface might be exposed to an external environment. For this reason, a coating layer typically forms a continuous film having a uniform thickness and covering the surface of a substrate.

The substrate, as noted above, is transparent, or substantially transparent, to low-energy x-rays. In order for the attenuation of x-rays attributable to the coating layer to be minimised, the thickness of the coating layer is typically less than 200 nm. In order to provide reliable coverage and protection against the external environment, the coating layer on the substrate is typically 10 nm thick or above. Depending upon the constituent materials selected for the coating layer, the thickness of the coating layer may range, in some embodiments, between 10 nm and 5000 nm, also depending upon the coating method.

A coating layer is typically of uniform thickness across the entire surface of the substrate. The coating layer typically conforms to the surface profile of the substrate as defined by the crystal grains and grain boundaries. In other words, the topography of the coating layer is such that the surface of the coating layer follows the profile of the substrate surface and the features thereon. Thus each crystal grain at the surface of the substrate typically has its exposed portion entirely covered by a portion of the coating layer, such that each adjacent portion of coating layer covering respective adjacent crystal grains at the surface of the substrate meet each other along the edges in the grain boundaries where the widths of the boundaries are at the atomic scale.

The porosity of the coating layer is typically less than or equal to 1%. Such a degree of porosity provides an advantageous degree of protection from gases and liquids so that these fluids may not reach and affect the window substrate.

Typically, the pinhole density of the coating layer is less than 10 $cm^{-2}$. This is a sufficiently low density of pinholes in the surface of the coating layer to prevent significant corrosion or oxidation of the substrate surface.

Figure 8:
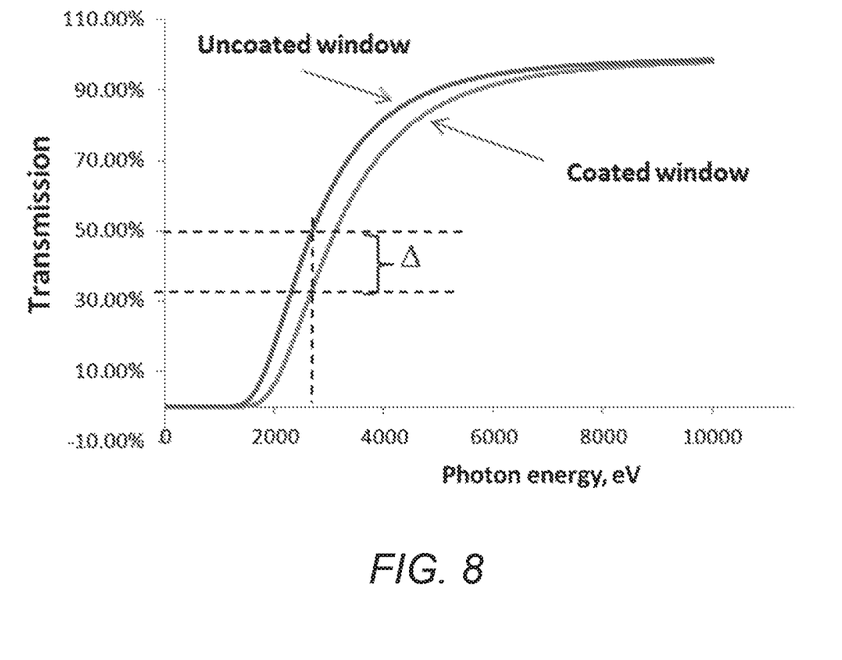

As noted above, the attenuation of the coating layer is important to the performance of the x-ray window member. Attenuation is quantified as a decrease of x-ray transmission for a substrate coated with a coating layer as a fraction of the transmission through an uncoated substrate, generally at the x-ray energy at which the degree of transmission through the uncoated substrate is 50%. FIG. 8 demonstrates this decrease, plotted alongside the transmission for the uncoated substrate X at a photon energy of around 2,500 keV. FIG. 8 shows the dependence of x-ray transmission upon incident photon energy, for both a coated substrate and an uncoated substrate. Typically, it is desired that the decrease A is less than 5% of X. Typically, therefore, the attenuation of low energy x-rays caused by the coating layer is less than or equal to 5% of the attenuation of low energy x-rays caused by the substrate.

In order to achieve a window member that does not significantly affect the transmission of x-rays therethrough, the thickness and the constituent material of the coating layer are typically selected in combination such that the attenuation of low energy x-rays caused by the coating layer is less than or equal to 5% of the attenuation of low-energy x-rays caused by the substrate. Preferably, the coating layer is formed from or, more preferably, only from materials comprising elements having atomic number between 5 and 80. Lower atomic number constituent materials give rise to lower levels of x-ray attenuation, and so the above-recited range of atomic numbers may be applied.

In some embodiments, the coating layer comprises an adhesion layer and a protection layer, wherein the adhesion layer affixes the protection layer to the surface of the substrate, and wherein the protection layer is non-porous. Typically, the first layer to be applied to a substrate surface, in such embodiments, is used to achieve good adhesion to the substrate. The second layer to be applied thereupon is typically selected and used for protecting the substrate from corrosion. Multi-layer window members may provide coating layers with a lower pinhole density in comparison with double layer coating layers.

Preferably, the porosity of the protection layer is sufficiently low to prevent the surface of the substrate being exposed to atmospheric gas or liquid.

In some embodiments, the adhesion layer comprises $Al_2O_3$, and the protection layer comprises $TiO_2$. Either of these sub-layer materials may also be used in combination with any other suitable materials for either the adhesion or coating layers. Thus, such a two-layer coating is not limited to the combination of $Al_2O_3$ and $TiO_2$), but may comprise other combinations with the same functionality.

In other embodiments, coating materials may include single layers of titanium oxide, aluminium oxide, zirconium oxide, tungsten oxide, titanium nitride, and multiple-layer aluminium oxide, zirconium oxide. Other examples of coating materials include titanium carbide, titanium diboride, boron nitride, boron carbide, and their combinations (TiNO, TiBN, TiAlSnN, TiAlN, etc.).

The thickness of each of the adhesion layer and the protection layer is typically less than 200 nm. This is advantageous in that it minimises the attenuation caused to x-rays transmitted through the window member.

Typically, the coating layer is disposed on the substrate by way of atomic layer deposition. This process provides the conformal and penetrating layer growth that results in a coating layer of even and uniform thickness and applied evenly over the surfaces of the grains and into the grain boundaries. This is advantageous for the protective penetrative quality of the coating layer. In some other embodiments, chemical vapour deposition is used to apply the coating layer to the surface of the substrate.

In some other embodiments, other traditional thin film growth techniques may be used, such as DC/RF sputtering and pulsed laser deposition (PLD). Most preferably, atomic layer deposition is used to apply the coating layer, since this technique is superior to the sputtering and CVD methods in terms of the quality of the films produced and the precision with which film thickness can be controlled. X-ray windows may be coated either by coating a bare substrate prior to brazing the substrate into a window assembly, or by coating the window assembly after brazing.

In some embodiments, the coating layer comprises an electrically conductive material. Preferably, the coating layer has a conductivity greater than $10^{-6}$ Sm$^{-1}$. In order to achieve the desired conductivity, the coating layer may comprise titanium dioxide doped with niobium, for example.

It is beneficial if transparency in the low energy x-ray band is maximised in the window member. Preferably, therefore, the substrate is substantially transparent to x-rays in the 0.5-10.0 keV energy band. The substrate preferably has a transmissivity greater than 90% for low energy x-rays, or for x-rays in the abovementioned energy band.

Transparent or substantially transparent substrates are advantageously used in combination with coating layers that likewise do not significantly attenuate x-ray transmission in the relevant energy band. Typically, the transmissivity of the substrate and the coating layer in combination is greater than 85% for x-rays in the 0.5-10.0 keV energy band.

Preferably, the deleterious effect of the coating layer on the effective transparencies to x-rays of the window member is minimal, and preferably is within 15% or more preferably 5%. Preferably, the transmissivity of the substrate and the coating layer in combination is greater than 95% of the transmissivity of the substrate alone.

In some embodiments, the substrate is formed from beryllium. In other embodiments, the substrate may be formed from aluminium, titanium, diamond, or silicon nitride.

BRIEF DESCRIPTION OF THE DRAWINGS

Some examples of the methods and product according to the invention are now described, with reference to the accompanying drawings, in which.

DESCRIPTION OF EMBODIMENTS

Figure 1:
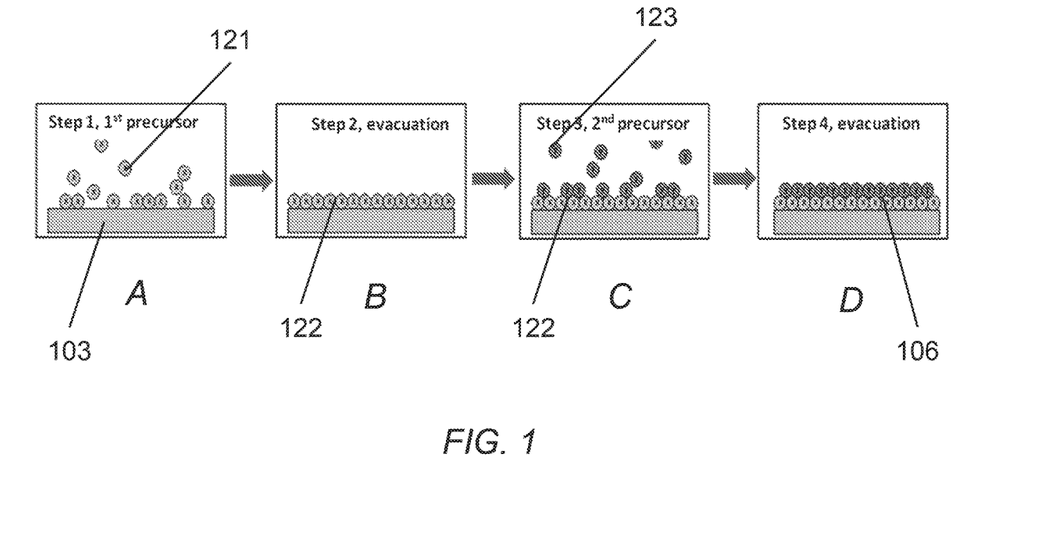
FIG. 1 is a schematic illustration of four stages of an atomic layer deposition process.

With reference to, FIG. 1, four stages of an example method for producing a window member according to the invention are shown. Specifically, the illustrated example is an atomic layer deposition (ALD) process. This is an ultra-thin coating method based on cyclic deposition and reaction. During such coating processes, two or more chemical vapours or gaseous precursors react sequentially on a substrate surface, producing a solid thin film. In such methods, an inert carrier gas flows through a system and precursors are injected by way of very short pulses into the carrier flow that transports the precursor into a reaction chamber.

At stage A a surface of a substrate 103 is exposed to a suitable gaseous reactant 121 which, upon reacting with the surface 103, forms a monolayer.

At stage B, excess reactant 121 and any by-products are purged out, or evacuated, by way of passing inert gases such as argon or nitrogen into the chamber, thus displacing the reactants or by-products.

At stage C (for an oxide film) an oxidant 123 such as atomic oxygen (O), hydrogen peroxide ($H_2O_2$), ozone ($O_3$), or water ($H_2O$), is introduced as a pulse into the chamber or tube. This has the effect of fully oxidising the previously adsorbed layer 122, thereby forming an oxide. Other reactants are used to form nitrides or carbides, as is well known in the art.

At stage D the excess oxidant 123 is purged out of the chamber or tube, again by way of delivering a pulse of argon or nitrogen or another suitable inert gas. Thus the substrate 103 coated with an oxide coating layer 106 is formed. Depending upon the desired thickness of the coating layer 106, the cycle of deposition illustrated through stages A-D may be repeated accordingly.

The result of the ALD process is a highly homogeneous and conformal film that extends continuously over the entire surface of the substrate 103. Coating 106 applied using this technique extends deep into trenches in the surface of the substrate, although no such trenches are shown in the portion of the substrate 103 shown in FIG. 1. As noted above, the number of times the reaction is repeated determines the thickness of the deposited coating 106.

Figure 2:
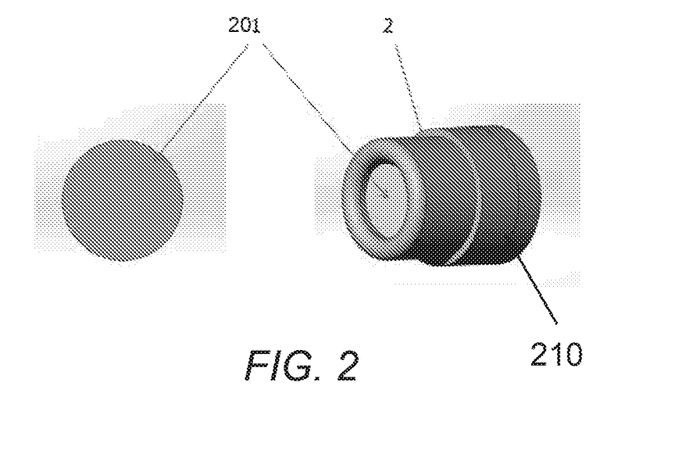
FIG. 2 shows a top view of a window member according to the invention alongside a perspective view of an assembly of an x-ray device comprising a window member according to the invention.

An example window member according to the invention is shown in FIG. 2 together with a portion of an x-ray device 210 in which the member is installed. The window member 201 comprises a polycrystalline beryllium substrate, wherein the micrometre sized beryllium grains are coated with an impermeable coating at a surface of the substrate. The x-ray window 201 is a circular disc with a diameter that is between 5 and 20 mm and a thickness that is between 12 and 500 μm.

There are a number of criteria by which the material and thin film growth method of the coating layer may be selected in order for the window member to meet the requirements of an x-ray window.

Figure 3:
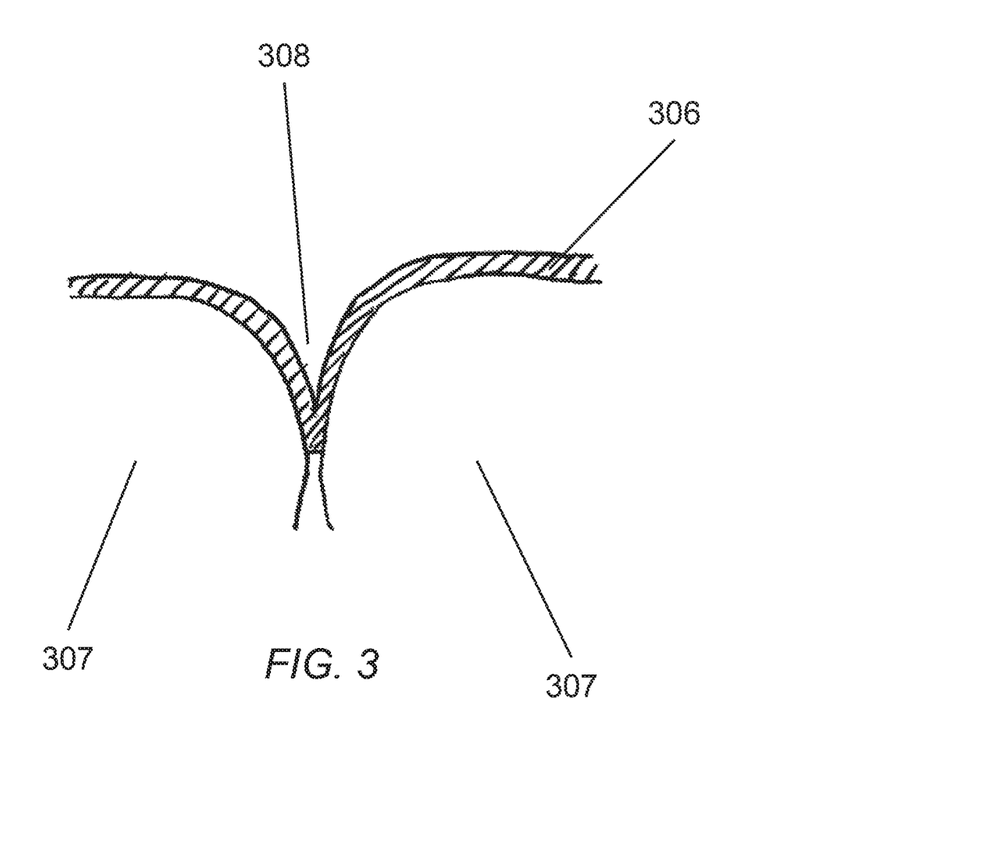
FIG. 3 schematically shows a portion of the surface of a window member according to the invention.

Firstly, the coating should be uniform and should cover the entire window surface, or the entire surface of the substrate that is to be exposed to the environment external to the x-ray device 210. The coating is grown on the substrate surface such that the profile of the coating repeats the surface profile of the substrate. A cross section of a grain boundary 308 between two adjacent beryllium crystal grains 307 in the surface of a substrate is shown schematically in FIG. 3. The coating layer 306 has been applied by way of atomic layer deposition and, as such, conforms to the surface profile of the grains 307. The coating layer therefore extends into the grain boundary 308 to a depth of approximately 100 nm below the outward most parts of the grains 307 that define the plane of the substrate surface. This is due to the ALD process uniformly coating all parts of the exposed grain surfaces down to a depth where the gap between adjacent beryllium crystalline reaches the atomic scale. Depths of over 100 nm are typically the point within surface grain boundaries at which the grain boundary gap in beryllium substrates narrows to this size. The isotropic growth caused by ALD therefore leaves no part of the substrate exposed, that is, not covered by the coating layer. In this way, the substrate of an installed window member 201 such as that in device 210 is fully isolated from the ambient atmosphere that is external to the device 210.

Another criterion for the coating layer is that it is in the form of a low-porosity film. That is, the coating contains no or negligible interstices through which any liquid or gas may pass. Thus, the coating serves to isolate the substrate upon which the film is disposed completely from the atmosphere, environment, or fluids on the other side of the coating layer to the substrate.

A further criterion is that the coating layer has a high transmissivity, of greater than 90%, to low energy x-ray radiation, that is in the 0.5-10.0 keV energy band.

A further consideration is that the coating layer has a high chemical stability, meaning that it is not reactive to the substrate or to the atmosphere or environment to which it may be exposed. Such a chemically stable coating layer will therefore retain its impermeable structure and total coverage of the window so as to continue to perform as a barrier that isolates the substrate from the external atmosphere.

The uniformity and the porosity of the coating layer depend in part upon the growth methods used to apply it. Table 1 below lists some commonly used growth methods (sputtering, pulsed laser deposition (PLD), chemical vapour deposition (CVD), atomic layer deposition (ALD) and sol-gel (solution-based)). A measured porosity and three-dimensional uniformity that is achievable using each method is set out in Table 1. It can be seen that a good degree of impermeability can be achieved using all methods except for sol-gel. However, as can be seen from the table, isotropic layer growth, which results in the formed layer conforming to the surface profile of the substrate and the grains therein and is indicated by 3D uniformity, can be achieved only by way of ALD and CVD. A reason for this is that isotropic growth should take place with a surface-limited reaction', and so sputtering and PLD-based growth is directional and occurs predominately or solely on surfaces or regions of the grains which are angled towards or facing the precursor material. Since beryllium and other polycrystalline materials comprise grains at their surface, which results in a non-smooth surface wherein the normal factor varies according to the grain structure intersected by grain boundaries, the grain boundaries may remain uncoated when using such methods. In these cases, the boundaries can provide leakage paths by which the external environment may contact the substrate.

A further consideration for the method by which the coating layer is formed is the ability to precisely control the thickness of the coating layer so that a side thickness may be achieved. This is advantageous since any excess thickness will reduce x-ray transmissivity owing to the presence of any greater depth of coating material through which x-rays must pass. Atomic layer deposition allows the greatest degree of layer thickness control, since it involves depositing material one atomic per cycle. Various techniques for performing CVD are available, varying in the pressure of the gas environment present during growth. Most commonly, CVD is performed at relatively high pressures ranging from atmospheric pressure to the order of several mTorr. In a variation on the previously described example method, the coating layer is applied using CVD at low pressure, approximately $10^{-3}$ Torr. This method allows a fine level of control of the coating layer thickness. The CVD method of applying the coating layer to the polycrystalline window is suitable for examples using very low atomic number materials to form the coating layer. Examples of such materials are diamond-like carbon, aluminium nitride, and boron carbide. Owing to their low atomic number, the coating layers produced from such materials give rise to x-ray attenuation in the desired energy band of 5% and under, in spite of the high growth rate and thick layers that typically result from CVD-based coating processes.

TABLE 1

|  | Impermeability | 3D uniformity |
|---|---|---|
| Atomic layer deposition | good | excellent |
| Chemical vapor deposition | good | good |
| Sputtering (DC/RF) | good | poor |
| Pulsed laser deposition | good | poor |
| Sol-gel | poor | good |

Figure 4:
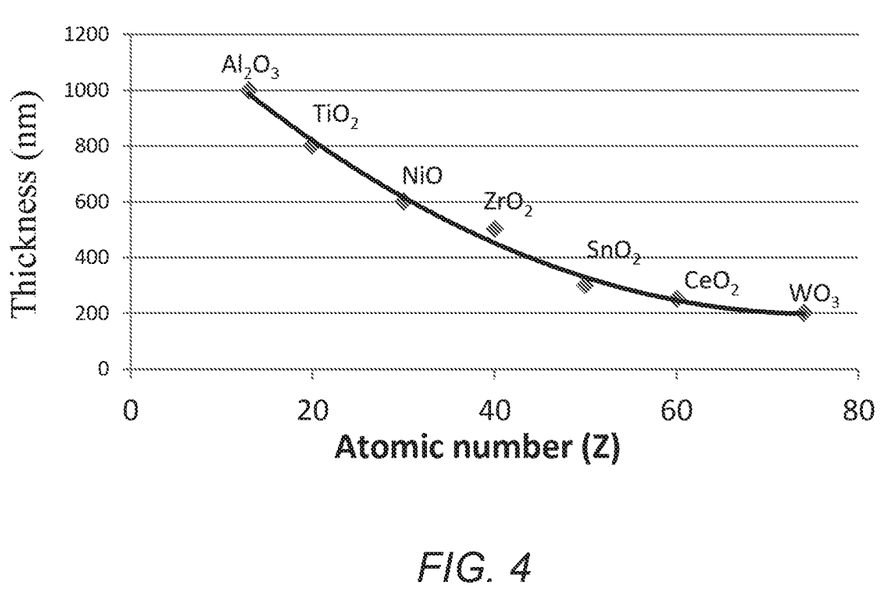
FIG. 4 shows the dependents of coating layer thickness upon the atomic number of coating layer constituent elements.

As indicated previously, the transmissivity of a coating layer to low energy x-rays is influenced by a combination of the atomic number (Z) of constituent elements of the coating layer, and the thickness of the layer. The lower the atomic number, the greater the thickness of the layer that can be employed in order to produce a coating of a given desired transmissivity. Experimental data demonstrating this relationship is shown in FIG. 4. Here the Y axis corresponds to the thickness of the coating layer. The of x-rays after passing through the beryllium substrate and coating layer should preferably not be less than 90% of the incident x-ray beam. The graph therefore illustrates the dependence of thickness of the coating layer upon the atomic number of the coating layer constituents that can still give rise to a coated window having an overall transmissivity above a 90% threshold. It can be seen that as the atomic number of the coating layer materials increases, the maximum thickness of coating layer which results in a transmissivity greater than a particular threshold value presenting a desired level of transparency decreases.

Figure 5:
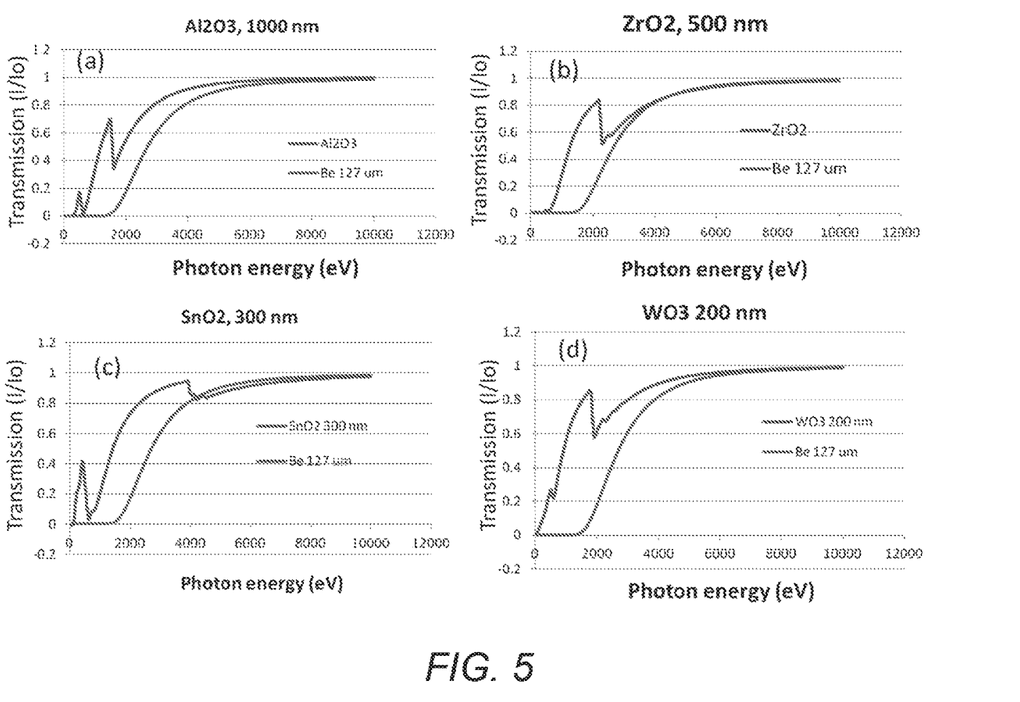
FIG. 5 shows transmission spectra for various substrates and coating layers according to the invention.

In the present example, the coating layer is formed from tungsten oxide ($WO_3$). The atomic number for tungsten is Z=74. It has been found that this example coating layer is effectively transparent to low energy x-rays in the aforementioned energy band for film thicknesses up to 100 nm. Measured transmissivity data for this example is shown in FIG. 5D. It has been found that coating thicknesses of 100 nm are sufficient to provide a degree of protective environmental isolation for a substrate to produce a five-fold increase in the useful lifetime of a window member.

FIGS. 5A, 5B, and 5C show the measured transmission spectra for 1 μm thick $Al_2O_3$, 500 nm thick, $ZrO_2$, and 300 nm thick $SnO_3$ coating layers respectively. Each of these is plotted alongside the transmission spectrum of a 127 μm thick beryllium substrate window, in combination with that of a beryllium substrate 127 μm thick, forming a coated window member. From these comparisons it can be seen that the transmission through the coating layers is comparable to the transmission through the beryllium window. Thus it can be seen that the additional x-ray attenuation attributable to the coating layers is insignificant.

A wide range of materials have been identified as being suitable, in accordance with the criteria set out above, for being used as corrosion-protective coating layers. Table 2 below lists a number of example coating layer materials alongside the growth methods of those mentioned previously which may be used to apply the respective coating layer materials to a substrate.

TABLE 2

| Materials | Growth method |
| --- | --- |
| $TiO_2$ | ALD, CVD |
| $Al_2O_3$ | ALD, CVD |
| $ZrO_2$ | ALD, CVD |
| SiN | ALD |
| $SiO_2$ | ALD |
| $TiB_2$ | CVD |
| $SnO_2$ | ALD, CVD |
| $SnO_2$:Sb | ALD, CVD |
| AlN | ALD, CVD |
| GaN | ALD, CVD |
| InN | ALD, CVD |
| TiN | ALD, CVD |
| $WO_3$ | ALD, CVD |
| $HfO_2$, | ALD, CVD |
| $In_2O_3$ | ALD, CVD |
| $Ga_2O_3$ | ALD, CVD |
| $Ta_2O_5$ | ALD, CVD |
| $SrTiO_3$ | ALD, CVD |
| CeO | ALD, CVD |
| $BaTiO_3$ | ALD, CVD |
| ZnO | ALD, CVD |
| ZnO:Al | ALD, CVD |
| MgO | ALD, CVD |
| $Ba_X(Y_{1-X})ZrO_3$ | ALD, CVD |
| $LaCoO_3$ | ALD, CVD |
| $Nb_2O_5$ | ALD, CVD |
| NiO | ALD, CVD |
| $Y_2O_3$ | ALD, CVD |
| $LaNiO_3$ | ALD, CVD |
| $La_2O_3$ | ALD, CVD |
| $YB_2Cu_3O_{7-X}$ | ALD, CVD |
| CaO | ALD, CVD |
| CuO | ALD, CVD |
| SiC | ALD, CVD |
| TiC | ALD, CVD |
| BC | ALD |
| Ti | ALD |
| Zr | ALD |
| Ni | ALD |

Figure 6:
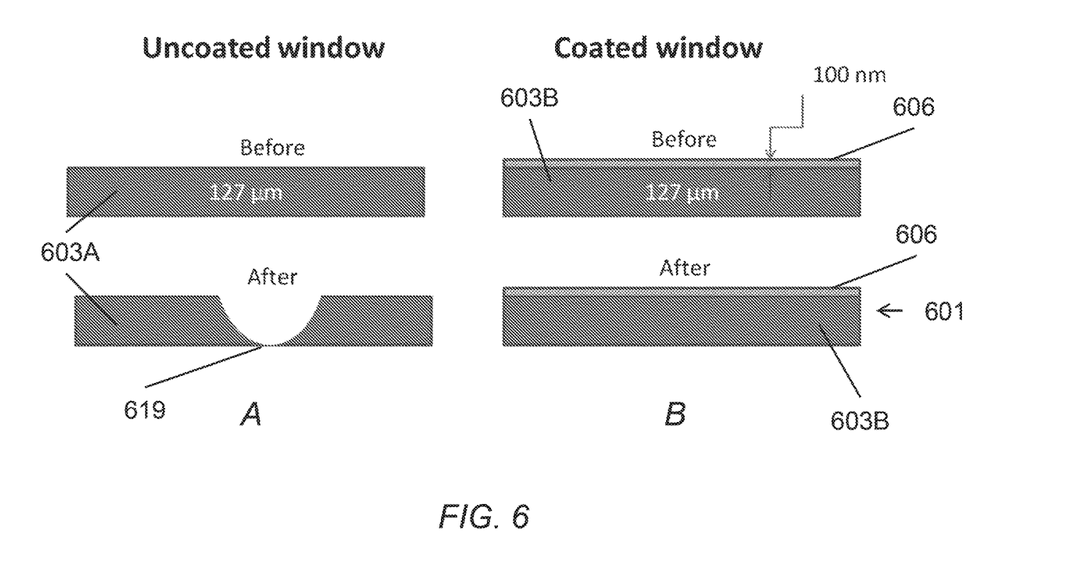
FIG. 6 schematically shows an uncoated substrate alongside a coated substrate according to the invention, both before and after exposure to simulated high humidity conditions.

Comparative studies of beryllium substrates according to the first example window member, for the purpose of illustrating the resistance of the coating layer to corrosion, have been performed with and without a coating layer. Coated and uncoated beryllium substrates were exposed to high levels of ambient humidity. High humidity was simulated by way of forming water drops on the centres of the beryllium substrates, and the substrates were placed on a hot plate. The experiments showed that uncoated beryllium substrates eroded over time, and formed a pit, while the surface of a beryllium substrate with a coating layer remained unchanged after being contacted with moisture. These results are illustrated in FIG. 6. The schematic drawing of Figure A shows an uncoated beryllium substrate 603A with a thickness of 127 μm. After being contacted with moisture in the conditions described above, a pit 619 is formed in the substrate 603A owing to the corrosion caused by the simulated high humidity. A similar substrate 603B, to which a 100 nm thick coating layer 606 was applied formed no pit in the same conditions. The unchanged state of the window member 601 comprising the coated substrate can be seen in the before and after drawings at B.

Thus it was found that the rate of erosion of the beryllium substrate is decreased significantly by the presence of the coating layer. No clear signs of erosion at all were found in the coated beryllium window.

Additionally, experiments with brazed window assemblies were performed. In these experiments it was found that assemblies with coated substrates exhibited more than five times the useful longevity of brazed window assemblies with uncoated windows.

Two methods of coating a substrate with corrosion resistive layers are coating a brazed window assembly, or brazing a coated window disc. The preferred method will depend upon the properties of the chosen coating materials. Materials capable of withstanding brazing temperatures of around 800° C. may be coated on their window discs, that is polycrystalline substrate discs, before brazing. Examples of coatings that are suitable to be applied in this way include boron nitride, boron carbide, and titanium nitride, which have melting temperatures greater than 2,500° C.

Materials with lower melting points are more suitable for being deposited upon window assemblies after they have been brazed. Examples of such materials include titanium dioxide, aluminium(iii) oxide, and zirconium dioxide.

Simulations and experimental studies have been performed in order to establish optimal or suitable coating layer thicknesses for window members. These have shown that materials with constituent atomic numbers up to Z=80 can be used. The optimum thickness depends upon the mass attenuation coefficient of the materials. This coefficient depends on the atomic number and the density of the material. The greater the values of these parameters, the smaller the coating layer thickness must be in order to achieve a sufficiently high transmissivity. Both elemental and compound materials may be used to form the coating layer.

In a second example window member, the coating layer comprises multiple sub-layers. In particular, the present example includes, as part of the coating layer, an adhesion layer and a protection layer. These different sub-layers, with different chemical compositions, are deposited on top of one another so as to form a stack upon the substrate. This arrangement comprises $Al_2O_3$ formed upon the substrate surface as an adhesion layer, with $TiO_2$ grown on top of the adhesion layer, as a protection layer.

As noted above, the maximum allowable thickness of a coating layer varies according to the mass attenuation coefficient of the coating layer. The criterion for this maximum allowable thickness may be determined by the requirement that the spectrum of x-ray transmission through the coating layer in the relevant x-ray energy band should be comparable to the transmission spectrum of the beryllium substrate itself. The spectra are plotted, as mentioned above, in FIGS. 5A-5D.

Variations of the example window members described thus far include substrates made from aluminium, titanium, diamond, and silicon nitride. Substrates formed from these various materials will have different degrees of surface roughness. Depending upon the surface roughness of each substrate, the minimum thickness for the coating layer that allows the coating layer to act as a protective, impermeable barrier, may be reduced to as little as 10 nm.

Figure 7:
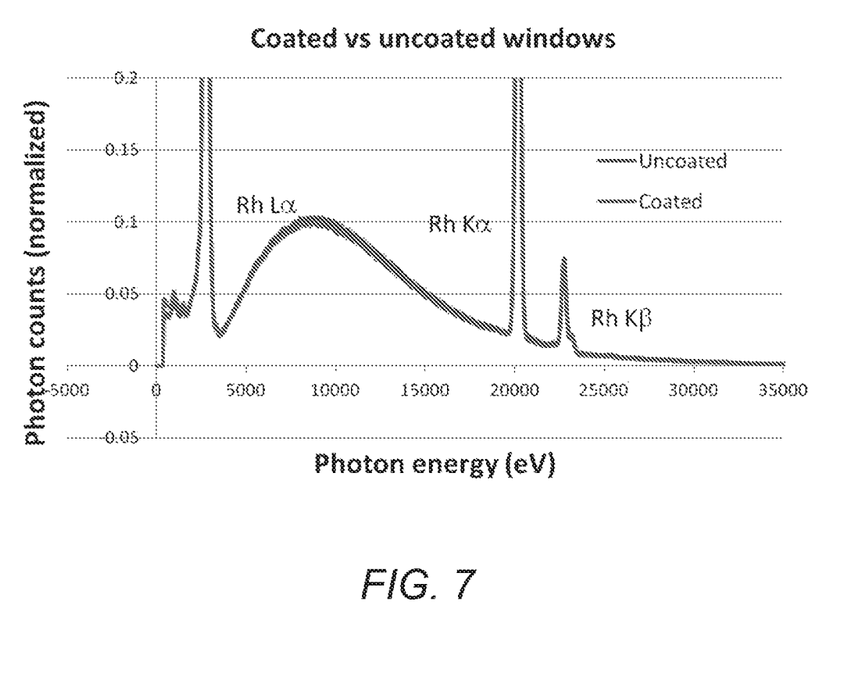
FIG. 7 shows output x-ray spectra for x-ray tubes with uncoated windows together with that of a tube comprising a coated window member according to the invention; and, FIG. 8 shows the dependence of transmissivity of x-ray windows on photon energy.

A further consideration in selecting constituent materials for a window member is that, as well as not significantly reducing the transmitted x-ray intensity, the window member materials must not contaminate output x-ray spectra by way of x-ray fluorescence caused by elements present in the window member itself. Experimental results from tests performed using an x-ray tube comprising an x-ray window coated with a $TiO_2$ coating layer are shown in FIG. 7. This data compares the x-ray spectra of tubes with coated and uncoated windows. It can be seen that no fluorescence lines from the coating material are present in the spectrum. Emission peaks at 2.7 keV, 20.21 keV and 22.72 keV correspond to rhodium $L_\alpha$, $K_\alpha$, and $K_\beta$ lines, respectively. No titanium fluorescence lines being detected in the spectrum means that this is a suitable material for transmitting uncontaminated x-rays through the window member coated with this protective coating.

The invention claimed is:

1. A method for forming a window member for separating an internal environment of an x-ray device from an environment external to the x-ray device, the method comprising:
providing a window member comprising a substrate having a first surface and a second surface opposite the first surface, and a coating layer having a first surface and a second surface opposite the first surface, wherein the substrate is closer to the internal environment than the coating layer, and the coating layer is closer to the external environment than the substrate, wherein the first surface of the substrate faces the internal environment, the second surface of the substrate faces the first surface of the coating layer, and the second surface of the coating layer faces the external environment, wherein the coating layer is disposed upon the second surface of the substrate by way of atomic layer deposition, and wherein:
the substrate is formed from a polycrystalline material and is substantially transparent to low-energy x-rays; and
the coating layer is non-porous, covers the crystal grains at the second surface of the substrate and extends into the grain boundaries therebetween, such that the coating layer forms an impermeable barrier between the substrate and the external environment.

2. A method according to claim 1, wherein the coating layer extends into the grain boundaries to a depth of at least 100 nm below the second surface of the substrate.

3. A method according to claim 1, wherein the coating layer extends into each grain of the boundaries to a depth at which the spacing between the grains at the boundary is the atomic scale.

4. A method according to claim 1, wherein the coating layer forms a continuous film having a uniform thickness and covering the second surface of the substrate.

5. A method according to claim 1, wherein the thickness of the coating layer is less than 200 nm.

6. A method according to claim 1, wherein the coating layer conforms to the second surface profile of the substrate as defined by the crystal grains and grain boundaries.

7. A method according to claim 1, wherein the porosity of the coating layer is less than or equal to 1%.

8. A method according to claim 1, wherein the pinhole density of the coating layer is less than 10 cm'.

9. A method according to claim 1, wherein the attenuation of low-energy x-rays caused by the coating layer is less than or equal to 5% of the attenuation of low-energy x-rays caused by the substrate.

10. A method according to claim 1, wherein the thickness and the constituent material of the coating layer are selected in combination such that the attenuation of low-energy x-rays caused by the coating layer is less than or equal to 5% of the attenuation of low-energy x-rays caused by the substrate.

11. A method according to claim 1, wherein the coating layer is formed only from materials comprising elements having atomic number between 8 and 80.

12. A method according to claim 1, wherein the coating layer comprises an adhesion layer and a protection layer, wherein the adhesion layer affixes the protection layer to the second surface of the substrate, and wherein the protection layer is non-porous.

13. A method according to claim 12, wherein the porosity of the protection layer is sufficiently low to prevent the second surface of the substrate being exposed to atmospheric gas or liquid.

14. A method according to claim 12, wherein the adhesion layer comprises $Al_2O_3$, and the protection layer comprises $TiO_2$.

15. A method according to claim 12, wherein the thickness of each of the adhesion layer and the protection layer is less than 200 nm.

16. A method according to claim 1, wherein the coating layer comprises an electrically conductive material.

17. A method according to claim 1, wherein the coating layer comprises $TiO_2$ doped with Nb.

18. A method according to claim 1, wherein the coating layer has a conductivity greater than $10^{-6}$ $Sm^{-1}$.

19. A method according to claim 1, wherein the substrate is substantially transparent to x-rays in the 0.5-10.0 keV energy band.

20. A method according to claim 1, wherein the substrate has a transmissivity greater than 90% for x-rays in the 0.5-10.0 keV energy band.

21. A method according to claim 1, wherein the transmissivity of the substrate and the coating layer in combination is greater than 85% for x-rays in the 0.5-10.0 keV energy band.

22. A method according to claim 1, wherein the transmittance of the substrate and the coating layer in combination is greater than 95% of the transmissivity of the substrate alone.

23. A method according to claim 1, wherein the substrate is formed from beryllium.

* * * * *